June 22, 1965 C. O. FORGE 3,191,062

PULSE AMPLIFYING CIRCUIT USING A STEP-RECOVERY DIODE FOR PULSE SHAPING

Filed July 6, 1962 2 Sheets-Sheet 1

INVENTOR
CHARLES O. FORGE

BY J. L. Chapman

ATTORNEY

June 22, 1965 C. O. FORGE 3,191,062

PULSE AMPLIFYING CIRCUIT USING A STEP-RECOVERY DIODE FOR PULSE SHAPING

Filed July 6, 1962 2 Sheets-Sheet 2

INVENTOR
CHARLES O. FORGE

BY Q. C. Smith
ATTORNEY 3,191,062

PULSE AMPLIFYING CIRCUIT USING A STEP-RECOVERY DIODE FOR PULSE SHAPING

Charles O. Forge, Cupertino, Calif., assignor to Hewlett-Packard Company, Palo Alto, Calif., a corporation of California Filed July 6, 1962, Ser. No. 207,884
4 Claims. (Cl. 307—88.5)

This invention relates to pulse amplifiers and more particularly to a solid-state circuit having a single gain element which produces an output pulse having the same polarity as the applied pulse.

Certain pulse applications require circuit means to amplify and sharpen an input pulse. In these applications it is desirable to use a minimum of circuitry and to obtain a very sharp output pulse having the same polarity as the input pulse.

Accordingly, it is an object of the present invention to provide a single stage pulse amplifier which produces a very sharp output pulse of the same polarity as the applied pulse.

It is another object of the present invention to provide an inexpensive solid-state pulse amplifier including a step-recovery semiconductor device to shape and amplify the applied pulse.

In accordance with a preferred embodiment of the present invention a semiconductor device is used which shows an abrupt change in reverse conductivity in response to the sudden depletion of carriers stored during a previous cycle of forward conductivity. This device in conjunction with a transistor amplifier produces a sharp output pulse a predetermined time after the application of an input pulse, which output pulse has the same polarity as the input pulse.

Figure 1:
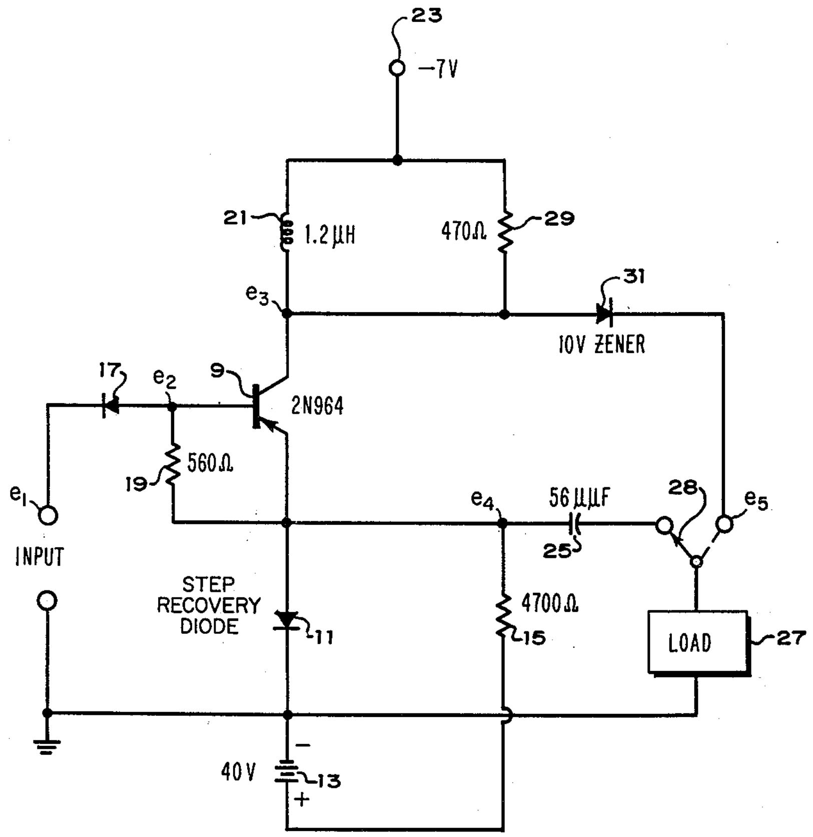
Figure 2:
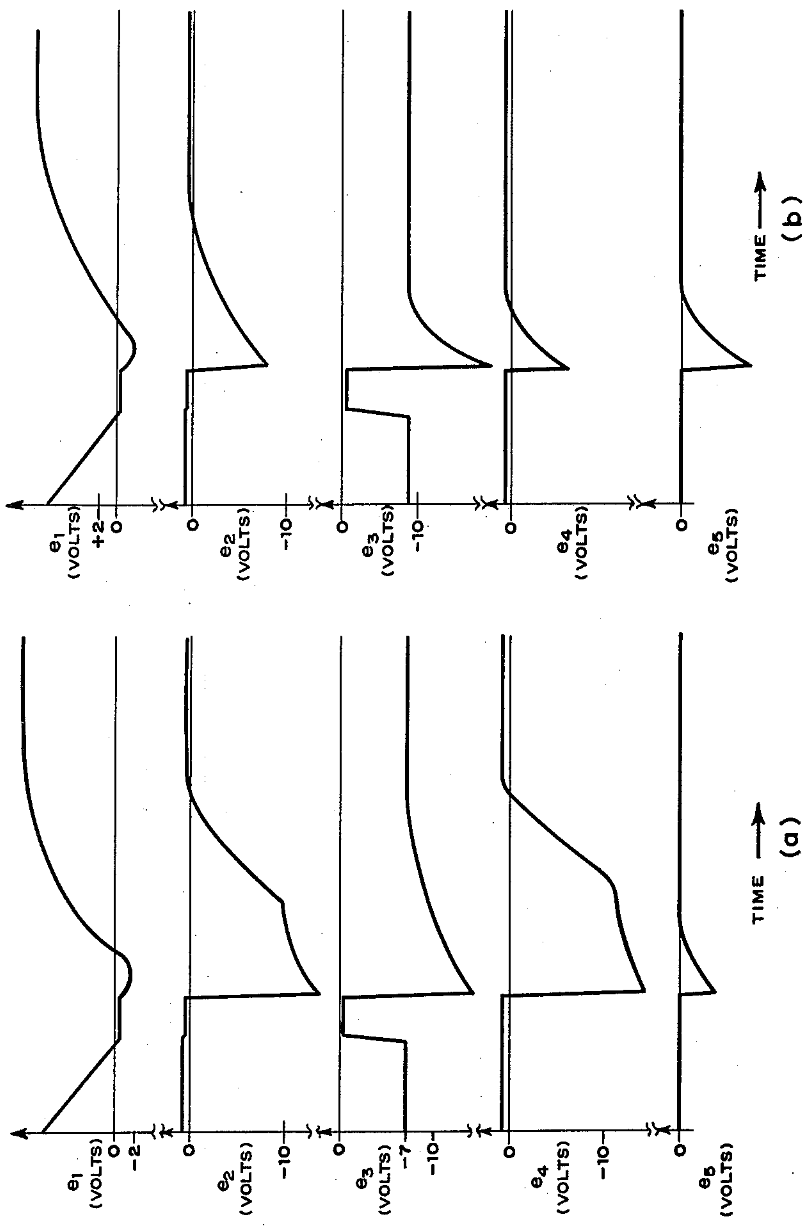

Other and incidental objects of the present invention will be apparent from a reading of this specification and an inspection of the accompanying drawing in which:

FIGURE 1 shows a schematic diagram of the circuit of the present invention,

FIGURE 2*a* shows the waveforms present at various places in the circuit of FIGURE 1 during typical operation with switch 28 in the position shown, and FIGURE 2*b* shows the waveforms present at various places in the circuit of FIGURE 1 during typical operation with switch 28 in the alternate position from the one shown.

Referring to the drawing, there is shown a transistor 9 with its emitter electrode connected to a step-recovery diode 11. Devices of this type are described in pending U.S. patent application Serial No. 27,943 filed May 9, 1960 by Albert F. Boff et al., now abandoned, and in J. Moll, S. Krakauer and R. Shen, "P-N Junction Charge-Storage Diodes," Proc. I.R.E., vol. 50, January 1962, pages 43–53. Voltage supply 13 and resistor 15 are connected to provide forward conduction current for step-recovery diode 11. A signal of proper polarity is applied to the base electrode of transistor 9 through diode 17 and resistor 19, or through other suitable means. Inductor 21 and negative supply voltage 23 provide bias for the output circuit of transistor 9 which comprises the emitter and collector electrodes thereof. Load 27 may be connected either through capacitor 25 to receive the signal appearing across step-recovery diode 11 or through diode 31 to receive the signal appearing on the collector electrode of transistor 9. Briefly, the step-recovery diode 11 is a semiconductor device having a diffused junction about which the gradient of impurity concentration increases rapidly with distance from the junction. This device is believed to store carriers in the immediate vicinity of the junction during forward conduction. It shows an abrupt change in conductivity when the supply of stored carriers is depleted during subsequent reverse conduction, which change is much faster in fact than the carrier lifetime.

In operation, a signal of negative polarity appearing at the input is applied to the base electrode of transistor 9 through diode 17 which is rendered conductive by the applied signal. This causes transistor 9 to draw collector current through step-recovery diode 11 in a direction which opposes the forward conduction current provided by voltage supply 13 and resistor 15. The collector current in transistor 9 opposes the conduction current in step-recovery diode 11 and increases above the base current substantially as the current gain of the transistor. Step-recovery diode 11 continues to conduct in the presence of stored carriers in the vicinity of its junction. At the same time charge builds up in the base region of transistor 9. When the supply of stored carriers in step-recovery diode 11 is depleted, the diode exhibits a sudden change in conductivity. This causes the voltage appearing across step-recovery diode 11 and at the emitter electrode of transistor 9 to change abruptly. This sudden change in voltage renders diode 17 nonconductive. Also, since charge is stored in the base region of transistor 9, the collector-emitter current cannot change abruptly. If a load 27 is connected through one pole of switch 28, as shown, and through capacitor 25 to the emitter electrode of transistor 9, then current which flowed in the transistor prior to the abrupt change in the conductivity of step-recovery diode 11 flows in the load 27. The emitter-collector current in transistor 9 then decreases exponentially as the charge stored in the base region of transistor 9 recombines internally according to the recombination lifetime of the transistor. This current flows in the load 27 and since the diode 17 is nonconductive, the output pulse is independent of the input pulse width. Thus, the output pulse appears as a very sharp wave front which decays exponentially to zero.

An alternate scheme is to connect the load 27 through the other pole of switch 28 and through break-down diode 31 to the collector electrode of transistor 9. When the step-recovery diode 11 changes conductivity abruptly as previously described, the transistor saturates and the emitter-collector current ceases to flow and the voltage appearing across inductor 21 reverses polarity. The break-down or Zener voltage of diode 31 is chosen near the value of negative supply voltage 23. This diode breaks down when the voltage across inductor 21 reverses polarity and thus the transistor current which previously flowed in inductor 21 then flows in the load 27 through diode 31. The output pulse in the load 27 thus appears as a very sharp wave front which decays exponentially to a value equal to the difference between the break-down voltage of diode 31 and the value of negative supply voltage 23. At that time diode 31 becomes nonconductive and the load 27 is thereby disconnected from the circuit. Resistor 29 is provided to damp out oscillations which may appear as a result of the inductance and stray circuit capacitances when the load 27 is removed from the circuit.

The single-stage circuit of the present invention thus provides pulse amplification without phase inversion using simple circuitry. Also the present invention sharpens an applied pulse and makes it available as an output pulse at one of several points in the circuit. Further, several such circuits may be cascaded to produce an extremely sharp, high energy pulse.

I claim:

1. A circuit for amplifying an input signal, said circuit comprising:

an electronic valve having a plurality of electrodes forming input and output circuits;

a step-recovery junction diode having contiguous P-type and N-type conductivity regions forming a junction about which the gradient of impurity concentration in said regions increases rapidly with distance from the junction, said diode being capable of storing charge in the vicinity of said junction during forward conduction of current through the diode and showing an abrupt change in reverse conductivity in response to the sudden depletion of stored carriers during subsequent reverse conduction of current through the diode;

means serially connecting the diode and the output circuit of said electronic valve;

a bias supply connected to said diode for providing forward conduction current therethrough;

means connected to the input circuit of said electronic valve for applying said input signal thereto with sufficient amplitude and polarity to increase the conduction of current in said output circuit for producing reverse conduction current in the diode; and means including said diode and said output circuit and responsive to the sudden depletion of stored carriers in said diode to produce an output pulse.

2. A circuit for amplifying input pulses, said circuit comprising:

a transistor having base and emitter electrodes forming an input circuit and having emitter and collector electrodes forming an output circut;

a step-recovery junction diode having contiguous P-type and N-type conductivity regions forming a junction about which the gradient of impurity concentration in said regions increases rapidly with distance from the junction, said diode being capable of storing charge in the vicinity of said junction during forward conduction of current through the diode and showing an abrupt change in reverse conductivity in response to the sudden depletion of stored carriers during subsequent reverse conduction of current through the diode;

a power supply having a pair of terminals;

a series circuit including the output circuit of said transistor and said diode connected to the emitter of said transistor connected between the terminals of said power supply;

a bias supply connected to said diode for providing forward conduction current in said diode;

means connected to the base electrode of said transistor for applying said input pulses thereto with sufficient amplitude and polarity to increase the conduction of current in said output circuit for producing reverse conduction current in said diode;

and means connected to the common terminal of said diode and emitter electrode for producing an output pulse in response to the sudden depletion of stored carriers in said diode.

3. A circuit for amplifying input pulses, said circuit comprising:

a transistor having base and emitter electrodes forming an input circuit and having emitter and collector electrodes forming an output circuit;

a step-recovery junction diode having contiguous P-type and N-type conductivity regions forming a junction about which the gradient of impurity concentration in said regions increases rapidly with distance from the junction, said diode being capable of storing charge in the vicinity of said junction during forward conduction of current through the diode and showing an abrupt change in reverse conductivity in response to the sudden depletion of stored carriers during subsequent reverse conduction of current through the diode;

a power supply having a pair of terminals;

inductive means connecting said collector electrode to one of said terminals;

means including said diode connecting said emitter electrode and the other of said terminals for interrupting the flow of current through said output circuit in response to the sudden depletion of stored carriers in said diode, said diode and the output circuit of said transistor being connected in current-conduction opposition;

a bias supply connected to said diode for providing forward conduction current in said diode, means connected to said input circuit for applying said input pulses thereto with sufficient amplitude and polarity to increase the conduction of current in said output circuit in conduction opposition to the forward conduction current in the diode, and circuit means connected to the common terminal of said inductive means and said collector electrode for producing an output pulse in response to the sudden depletion of stored carriers in said diode.

4. A circuit as in claim 3 wherein:

said circuit means includes a Zener diode poled to conduct said output pulse in the Zener breakdown region.

References Cited by the Examiner

UNITED STATES PATENTS

| | | | |
|---|---|---|---|
| 2,840,728 | 6/58 | Haugh et al. | 307—88.5 |
| 2,924,725 | 2/60 | Blair | 307—88.5 |
| 2,979,627 | 4/61 | Halpern | 307—88.5 |
| 3,001,087 | 9/61 | Harloff | 307—88.5 |
| 3,076,105 | 1/63 | Robinson et al. | 307—88.5 |
| 3,076,902 | 2/63 | Van Duzer et al. | 307—88.5 |
| 3,085,164 | 4/63 | Olsson | 307—88.5 |
| 3,090,926 | 5/63 | Engel | 307—88.5 |
| 3,157,842 | 11/64 | Hoeks | 307—88.5 |

OTHER REFERENCES

Moll et al.: P-N Junction Charge-Storage Diodes, Proceedings of the IRE, January 1962.

JOHN W. HUCKERT, *Primary Examiner.*